(12) United States Patent
Parizh et al.

(10) Patent No.: US 9,638,776 B2
(45) Date of Patent: May 2, 2017

(54) NESTED COIL CONFIGURATION OF ACTIVE SHIMS IN MRI SYSTEMS

(71) Applicant: GENERAL ELECTRIC COMPANY, Schenectady, NY (US)

(72) Inventors: Michael Parizh, Niskayuna, NY (US); Derek Allan Seeber, Florence, SC (US); Seung-Kyun Lee, Cohoes, NY (US); Jean-Baptiste Mathieu, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 435 days.

(21) Appl. No.: 14/466,551

(22) Filed: Aug. 22, 2014

(65) Prior Publication Data

US 2016/0054407 A1   Feb. 25, 2016

(51) Int. Cl.
*G01R 33/3875* (2006.01)

(52) U.S. Cl.
CPC ................................ *G01R 33/3875* (2013.01)

(58) Field of Classification Search
CPC .................................................. G01R 33/3876
See application file for complete search history.

(56) References Cited

U.S. PATENT DOCUMENTS

| | | | |
|---|---|---|---|
| 4,590,427 A | 5/1986 | Fukushima et al. | |
| 4,701,736 A | 10/1987 | McDougall et al. | |
| 5,146,197 A | 9/1992 | Lowe | |
| 5,646,532 A * | 7/1997 | Knuttel | G01R 33/3815 324/321 |
| 6,002,255 A | 12/1999 | Pulyer | |
| 7,330,031 B2 | 2/2008 | Speck et al. | |
| 7,427,908 B1 | 9/2008 | Painter et al. | |
| 2006/0181381 A1 | 8/2006 | Markiewicz et al. | |
| 2011/0084206 A1 | 4/2011 | Neuberth et al. | |
| 2011/0260727 A1 | 10/2011 | Punchard et al. | |
| 2012/0098541 A1* | 4/2012 | Konijn | G01R 33/3875 324/322 |
| 2013/0147476 A1 | 6/2013 | Shvartsman et al. | |

FOREIGN PATENT DOCUMENTS

GB   2474343 A   4/2011

OTHER PUBLICATIONS

Dietz et al., "Gradients in Ultra High Field (UHF) MRI" High-Field MRI Imaging. Medical Radiology, Diagnostic Imaging, pp. 27-40, 2011.

Bobrov et al., "A General Method of Design of Axial and Radial Shim Coils for NMR and MRI Magnets", IEEE Transactions on Magnetics, vol. 24, Issue 1, pp. 533-536, 1998.

(Continued)

*Primary Examiner* — G. M. Hyder
(74) *Attorney, Agent, or Firm* — Nitin N. Joshi

(57) ABSTRACT

Embodiments of the invention are utilized to improve shimming capability while reducing radial space and the volume required to contain active shim coils by nesting the coils of different degrees and orders inside each other and limiting the azimuthal span of the individual saddle coils. This allows two or more radial shim sets to be combined together in the same layer resulting in a significant radial savings that increases the useable portion of an MRI system.

19 Claims, 4 Drawing Sheets

(56) References Cited

OTHER PUBLICATIONS

Kim et al., "Regularized Higher-Order in Vivo Shimming", Magnetic Resonance in Medicine, vol. 48, pp. 715-722, 2002.
Clare et al., "Requirements for Room Temperature Shimming of the Human Brain", Magnetic Resonance in Medicine, vol. 55, pp. 210-214, 2006.
Hetherington et al., "Robust Fully-Automated Shimming of the Human Brain for High-Field 1H Spectroscopic Imaging", Magnetic Resonance in Medicine, vol. 56, pp. 26-33, 2006.
Green et al., "Asymmetric head gradient coil for imaging and spectroscopy at 7T", Magnetic Resonance Medicine, vol. 16, pp. 346, 2008.
Juchem et al,. "Magnetic Field Homogenization of the Human Prefrontal Cortex with a Set of Localized Electrical Coils", Magnetic Resonance Medicine, vol. 63, Issue 1, pp. 171-180, Jan. 2010.
Pan et al., "Role of Very High Order and Degree B0 Shimming for High-Field 1H Spectroscopic Imaging of the Human Brain at 7 Tesla", Magnetic Resonance in Medicine, vol. 68, pp. 1007-1017, 2011.
Cosmus et al., "Advances in Whole-Body MRI Magnets", IEEE Transactions on Applied Superconductivity, vol. 21, Issue 3, pp. 2104-2109, 2011.
Lvovsky et al., "Novel technologies and configurations of superconducting magnets for MRI", Superconductor Science Technology, vol. 6, 2013.

\* cited by examiner

NESTED COIL CONFIGURATION OF ACTIVE SHIMS IN MRI SYSTEMS

FIELD

The subject matter disclosed herein relates to magnetic resonance imaging (MRI), particularly as it relates to resistive shims used for compensation of relatively small magnetic field disturbances introduced by an investigated object.

BACKGROUND

A static magnetic field is used by Magnetic Resonance Imaging (MRI) scanners to align the nuclear spins of atoms as part of the procedure for producing images within the body of a patient. This static magnetic field is referred to as the $B_o$ field. It is commonly known that increasing the homogeneity of the $B_o$ field used for performing an MRI scan increases the quality of the diagnostic images, which benefits physicians using an MRI image to diagnose a patient.

Magnetic Resonance Imaging (MRI) utilizes very high magnetic field uniformity on the order of 10 parts-per-million (ppm) over the field-of-view (FOV), typically about 50 cm diameter sphere. A variety of shimming techniques are used to compensate for the magnetic field non-uniformity that occurs due to manufacturing tolerances of the magnet, external magnetic environment, or field disturbances introduced by the investigated subject.

For instance, the major manufacturing and environmental magnetic field disturbances are addressed by either passive shims, or superconducting shims, or both. Passive shims are typically precisely-positioned pieces of magnetic material such as iron. The strong active superconducting shims are located inside the cryostat. Typically, the shims are not re-adjusted for a particular patient. Resistive shims are used for compensation of relatively small field disturbances introduced by the investigated subject. In MRI scanners, resistive shims are located inside the gradient coil assembly. Both types of the active electric shims are used in Nuclear Magnetic Resonance (NMR) and Fourier Transform Ion Cyclotron Resonance (FT-ICR) systems.

Recent advances in MRI technology have sought to include increased field strength of the scanners, increased aperture MRI systems and more powerful, higher linearity gradient coils. In these systems, radial space available to active shims is restricted. This is a serious constraint for resistive shims. At the same time, applications such as diffusion and functional imaging in brain require versatile resistive shims that are capable of compensating yet higher-order spherical harmonics. orthogonally The magnetic field inside the magnet in a source-free region is described by the Laplace equation $\nabla^2 B_z=0$. Solution of this equation in spherical coordinates is:

$$B_z(r,\theta,\phi)=\Sigma_{n=0}^{\infty}\Sigma_{M=0}^{N}A_{NM}r^{N}P_{NM}(\cos\theta)e^{iM\phi}, \quad \text{(EQUATION 1)}$$

where $P_{NM}=P_{NM}(\cos\theta)$ are associated Legendre polynomials of the degree N and order M; index N runs from zero to infinity; index M changes from zero to N;

$$\cos\varphi = \frac{z}{r}, \cos\theta = \frac{x}{r\sin\varphi}; \sin\theta = \frac{y}{r\sin\varphi},$$

and x, y and z are Cartesian coordinates of a point, $r=(x^2+y^2+z^2)^{1/2}$.

The dimensional product $A_{NM}r^{N}P_{NM}(\cos\theta)e^{iM\phi}$ in Equation 1 represents orthogonal cosine and sine N, M spherical harmonics of the magnetic field; these harmonics are often noted as the (N, M) harmonics, or terms. The field harmonics with M=0 are often called axial harmonics; these harmonics do not depend on the angle $\phi$. Harmonics with M>0 are called radial, or tesseral harmonics; these harmonics do depend on the angle $\phi$.

Those skilled in the art recognize two approaches as to design of the electric shims:

$1^{st}$ Approach:

Orthogonal shim approach. Each shim is designed to generate a certain field harmonic while other harmonics are relatively small or zero. The orthogonal shims are distinguished by application (axial, M=0, and radial shims, M>0) and degree (N=0, 1, 2, 3, ...).

The first order components of the spherical harmonics are typically shimmed using the magnetic field gradient coils and the higher order terms are shimmed using dedicated shimming coils. The magnetic field gradient coils create gradients in the magnetic field in order to spatially encode the radio frequency signals that the nuclei emit during MRI.

$2^{nd}$ Approach:

Matrix shims. MRI systems include multiple shims each of which may simultaneously generate a variety of odd, even, axial and radial terms.

Several approaches have been proposed to make more compact and more efficient resistive shims. Most are dedicated to so-called matrix shims, see, for example. The matrix shims occupy a smaller radial space at a penalty of complicated circuitry, a significant number of external drivers (typically more than twice as many drivers versus traditional orthogonal shims), along with complicated software to control the drivers.

A side-by-side location of the resistive shims has also been proposed to reduce the volume required to contain the shimming coils by limiting the azimuthal span of the individual saddle coils. This allows shim coils of the same degree and order to be combined together in the same radial layer. The side-by-side located shims, however, may exhibit known disadvantages including reduced shim strength due to smaller angle of the arc and appearance of the unwanted terms.

A need exists to address the multiple trade-offs, including shim performance (e.g. strength, purity, interaction with other components of the scanner), spatial constraints, ease of use, shim wiring complexity, the number and sophistication of external drivers, sensitivity to positional tolerances and other issues. The proposed invention will further improve shimming capability by proposing nested saddle coils of different order and/or degree inside each other.

SUMMARY

The above and other drawbacks or deficiencies may be overcome or alleviated by development of a system as described as follows.

Embodiments of the invention reduce image quality problems caused by high order eddy currents in MRI. In addition, gradient coil performance verification occurs before the gradient coil prototype is built. Thus, validation of image quality impact of eddy current specifications can be determined before manufacturing. Furthermore, the generation of transfer function of eddy current impact on image quality can be combined by super-positioning methods to virtually assess gradient performance.

Technical and commercial advantages include better image quality as no eddy current effects are presented. Better engineering tools and design specifications can thus be utilized.

The proposed invention improves shimming capability by nesting saddle coils of different order and/or degree inside each other. In addition, since the matrix shim coils themselves can cause eddy current problems, the apparatus advantageously addresses operation of the shim coils so that the leakage field is nulled, similar to how the shield coil of a gradient coil helps reduce eddy current by providing better shielding. In this sense the matrix shim coils are used as matrix "shield" coils.

In one embodiment of the invention, a nested shim coil assembly is disclosed for shimming the magnetic field of a magnetic resonance system by generating spherical harmonics of a sine type and a cosine type of the magnetic field in order to compensate radial harmonics, the nested shim coil assembly comprising a plurality of saddle-shape coils each having electrical connections, said saddle-shape coils configured in pairs to define at least a first set of saddle-shape coils and a second set of saddle-shape coils, wherein the first set of saddle-shape coils shim a field with a first degree order and a first degree index, and having a first azimuthal span, and the second set of saddle-shape coils shim a second order and a second degree index, and having a second azimuthal span, wherein the first set of saddle-shape coils are nested within the second set of saddle-shape coils to occupy a reduced radial space; wherein the first azimuthal span is less than the second azimuthal span, and wherein the combination of the first order and the first degree index are different from the second order and the second degree index, and the first set of saddle-shape coils and the second set of saddle-shape coils are combined together in the same radial assembly.

In one aspect, the nested shim coil assembly includes the first set of saddle-shape coils having a first direction of current and the second set of saddle-shape coils having a second non-identical direction of current. In another aspect, the first set of saddle-shape coils shim the spherical harmonic of the sine type of the magnetic field and the second set of saddle-shape coils shim the spherical harmonic of the cosine type of the magnetic field, or vice versa; wherein the sine type and the cosine type are positioned at a rotation of at or less than about 90° per order from each other. Further, the electrical connections of the plurality of saddle-shape coils are connected in series.

Embodiments of the invention also utilizes the first set of saddle-shape coils to have at least four arcs that determine the first azimuthal span less and the second set of saddle-shape coils to have at least four arcs that determine the second azimuthal span, and when combined together, a resulting azimuthal span is less than 360°. In one embodiment, the arc at z displacements greater than zero has a reduced shim strength and an improved shim purity. In another embodiment, the arc has an axial location normalized to a shim radius. The first and second sets of saddle-shape coils have zero coupling with each other. Further, embodiments disclose the plurality of saddle-shape coils to include multiple nested arc conductors of varying lengths within the same radial assembly.

In one aspect, then, the first and second sets of saddle-shape shims are constructed on a single printed circuit board. One aspect has a single printed circuit board that is flexible.

Embodiments of the invention also disclose a magnetic field shimming system for a magnetic resonance imaging system comprising: a nested shim coil assembly according to the above described limitations, further comprising turns of each saddle-shape coil evenly split such that the turns are distributed to reduce harmonics, and a first current loop associated with one saddle-shape coil has a different current direction than a second current loop associated with an adjacent saddle-shape coil; wherein the nested shim coil assembly is cylindrical and adapted for fitting within a bore of a magnet, and along its axis of symmetry adapted for receiving a subject; a power supply for supplying electrical power to the nested shim coil assembly, a set of electrical connections adapted for supplying current to an arc conductor of each nested shim coil assembly; and a first control system adapted for controlling the electrical power supplied by the power supply.

In one aspect, the magnetic field shimming system has at least one nested shim coil assembly has non-zero coupling with the magnet. In another aspect, at least one nested shim coil assembly has zero coupling with the magnet, gradient coils and axial shim sets; and non-zero coupling between the first set of saddle-shape coils and the second set of saddle-shape coils.

Embodiments of the magnetic field shimming system have reduced higher-order harmonics when the nested shim coil assembly comprises at least an eight-coil configuration. As such, the first saddle-shape coil and the second saddle-shape coil have high-purity angles of about 120° and about 90°. In one aspect, the magnetic field shimming system further comprises more than one nested shim coil assembly arranged in a single radial assembly. Further, the magnetic field shimming system may implement distributed turns of the arc conductors to cancel the harmonics.

Other embodiments of the magnetic field shimming system include the nested shim coil assembly integrated with matrix shims. Furthermore, the magnetic field shimming system in one embodiment utilizes the nested shim coil assembly arranged in a set of multiple saddle coils.

DETAILED DESCRIPTION

Figure 1:
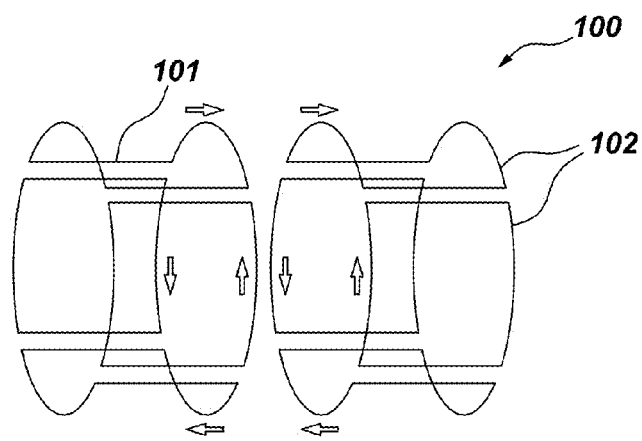
FIG. 1 (PRIOR ART) depicts a configuration for the (2,2) shim.

Various embodiments will be described more fully hereinafter with reference to the accompanying drawings. Such embodiments should not be construed as limiting. For example, one or more aspects can be utilized in other embodiments and even other types of devices. Referring to the drawings in general, it will be understood that the illustrations are for the purpose of describing particular embodiments and are not intended to be limiting.

Embodiments of the invention herein disclosed are related to shims that compensate radial harmonics. Although the invention is applicable to both orthogonal and matrix shims, it will be illustrated on example of the orthogonal shims.

As depicted in FIG. 1 (PRIOR ART), orthogonal radial shims 100 are built of a plurality of saddle-shape coils that include straight sections 101 and arcs 102. These saddle coils 102 are described by location of the arcs, angle and direction of current in the coils (designated by arrows). One embodiment that utilizes an angle α to provide the maximum strength of the orthogonal radial shims is 180°/M. For example, the saddle coils of the $2^{nd}$-order shims provide the maximum strength using 90° arcs, the $3^{rd}$-order shims use 60° arcs, etc.

From EQUATION 1, if the expression αM/360° is an integer number, the $M^{th}$ order harmonic is zero, and the shims generate zero fourth order terms if α=90°. In addition, current direction in adjacent saddle coils is opposite. As illustrated, the (2,2) shim set 100 comprises eight 90° coils. Current direction is designated by arrows. For shim configurations in embodiments of the present invention, it is beneficial to nest sets of the same order M inside each other. See embodiments of FIGS. 4 and 6.

Figure 2A:
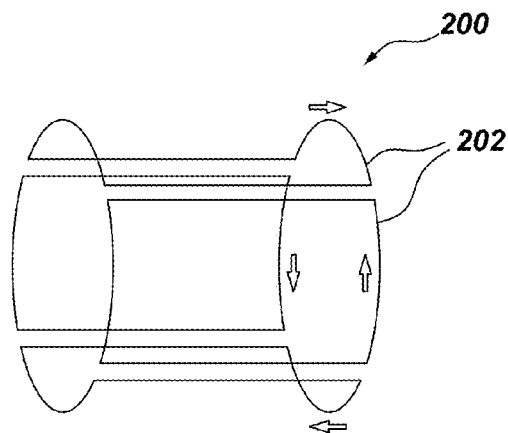
FIG. 2A (PRIOR ART) illustrates a configuration for the (3,2) shim set that has of four coils.
Figure 2B:
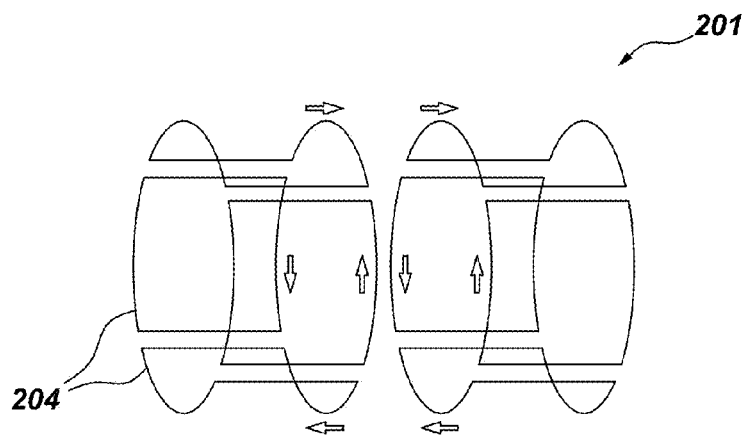
FIG. 2B (PRIOR ART) illustrates a prior-art configuration for the (3,2) shim set that has of eight coils.

As depicted in FIG. 2A (PRIOR ART), a (3,2) shim set 200 is configured having four coils 202. FIG. 2B (PRIOR ART) also illustrates a (3,2) shim set 201, but configured with eight coils 204. The strength-optimized number of saddle coils in orthogonal shim sets is 4M if N+M is even, and 2M for odd N+M values. In the latter case, shim sets may be designed such that the mid-plane of the system intersects individual saddle coils. The sine shim set is typically the cosine shim set rotated 90°/M Degrees. In embodiments of the invention, reduction or elimination of unwanted harmonics in the orthogonal shims may result in different, typically smaller angles.

Figure 3A:
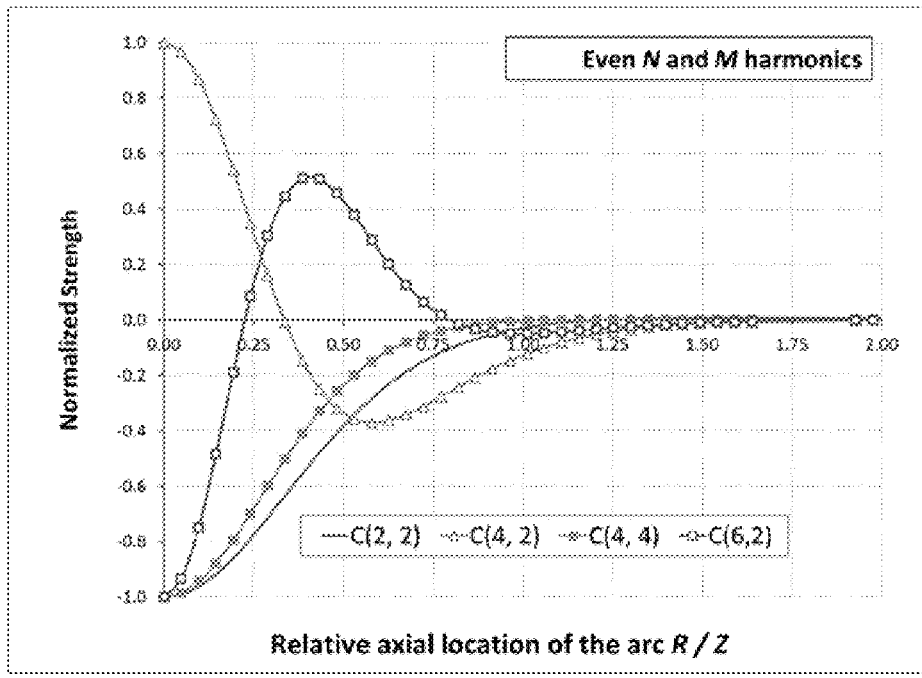
FIG. 3A is a graphical illustration of an embodiment of the invention.
Figure 3B:
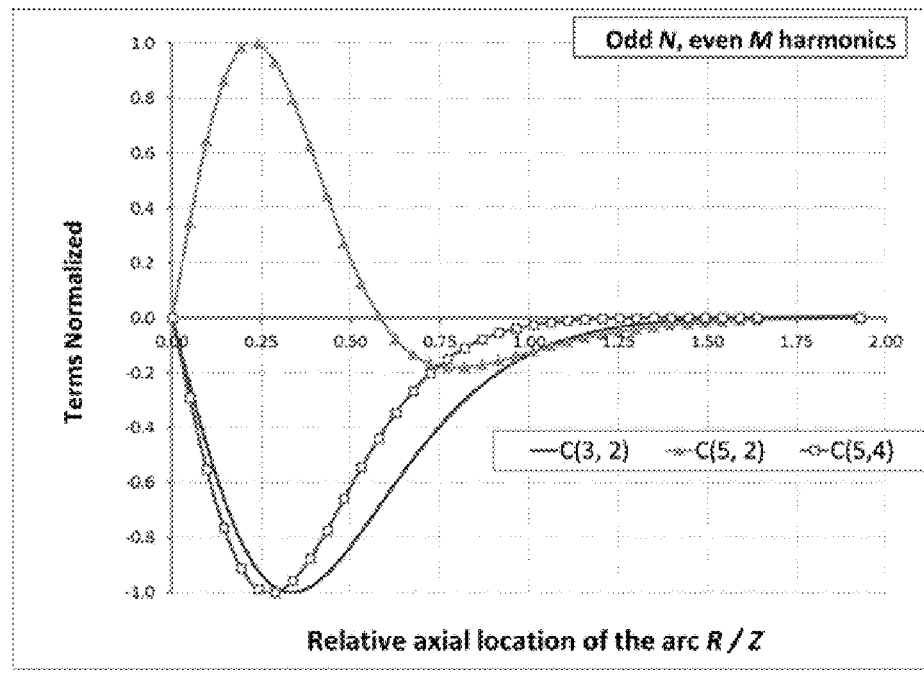
FIG. 3B is another graphical illustration of an embodiment of the invention.

Shimming properties of the saddle coils are determined by arcs. Straight sections of the coils do not produce magnetic field $B_z$ along the magnet axis. Location of the inner arcs is a dominant factor that determines shimming strength and purity. Shim purity, or reduction/elimination of unwanted harmonics is one of the major drivers for axial location of the coil arcs. In FIG. 3, the graphical analysis depicts harmonics produced by arcs versus axial location of the arc. One embodiment illustrates this approach, for example, a (2,2) shim set in FIG. 3A; another embodiment in FIG. 3B illustrates a (3,2) shim set. Axial location of the arc is normalized to shim radius. In FIG. 3A, the N and M shims are even; in FIG. 3B, the N shim is odd and the M shim is even. The maximum strength of the (2,2) shim would be for arc location at z=0. At this location, however, the shim purity will be poor due to high (4,2) harmonic. Designers may position the arc at z=0.34R where the (4,2) term is zero at a penalty of about 40% reduction of the shim strength. Although the (6,2), (6,6) harmonics are not zero, the shim purity is dramatically improved. The (4,4), (6,4) terms may be set to zero by selection of the coil angle α at 90°. The preferred location of the inner arcs for some high-purity shims is shown in Table 1.

TABLE 1

Arc location in certain high purity shims

| Shim set | Cancelled term | Arc location, Z/R |
|---|---|---|
| (2, 1) | (4, 1) | 0.67 |
| (2, 2) | (4, 2) | 0.34 |

TABLE 1-continued

Arc location in certain high purity shims

| Shim set | Cancelled term | Arc location, Z/R |
|---|---|---|
| (3, 1) | (1, 1) | 0.29 |
|  | (5, 1) | 0.92 |
| (3, 2) | (5, 2) | 0.58 |

Other factors such as shim purity, reduction of the shim interaction with other MRI system components, and space availability may utilize more sophisticated shape of the shim coils. For example, the more complicated eight-coil configuration in FIG. 2B of the (3,2) shim may provide smaller unwanted high-order harmonics. In one aspect, the shims may use fewer coils at a penalty of magnetic coupling with other components of an MRI system. For example, elimination of four coils at 90° and 270° in the (2,2) shim set will reduce the shim strength proportionally to reduce turn count. This shim set, however, has non-zero coupling with the main magnet. This effect may result in shim overload during magnet quench or change in the magnet current after energizing shim coils.

Embodiments of the invention reduce the volume required to contain the active shim coils by nesting the coils of different degrees and orders inside each other and limiting the azimuthal span of the individual saddle coils. This allows two or more radial shim sets to be combined together in the same layer resulting in a significant radial savings that increases the useable portion of an MRI system.

Figure 4:
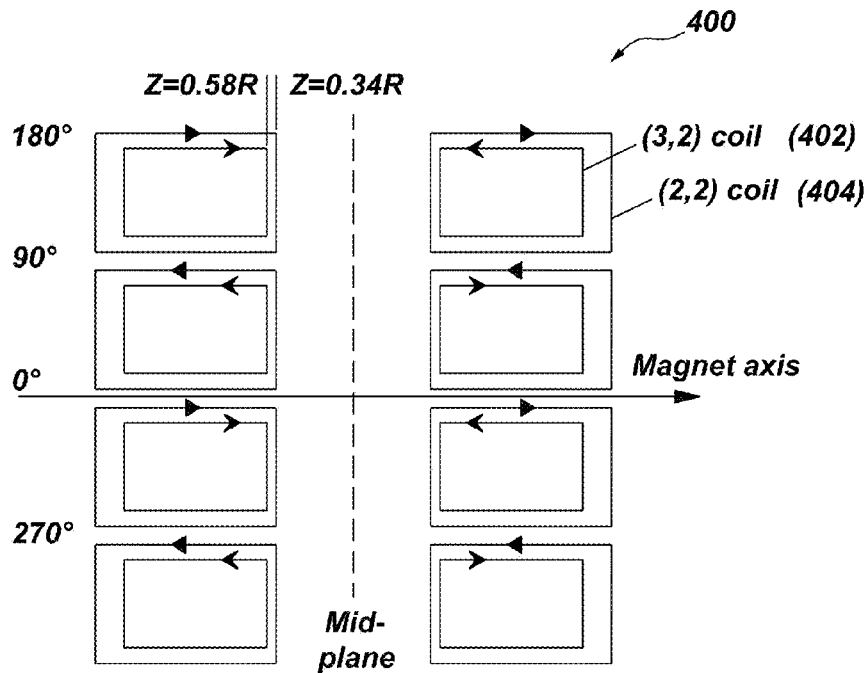
FIG. 4 depicts an embodiment of the invention with two orthogonal eight-coil shim sets nested inside each other.
Figure 5:
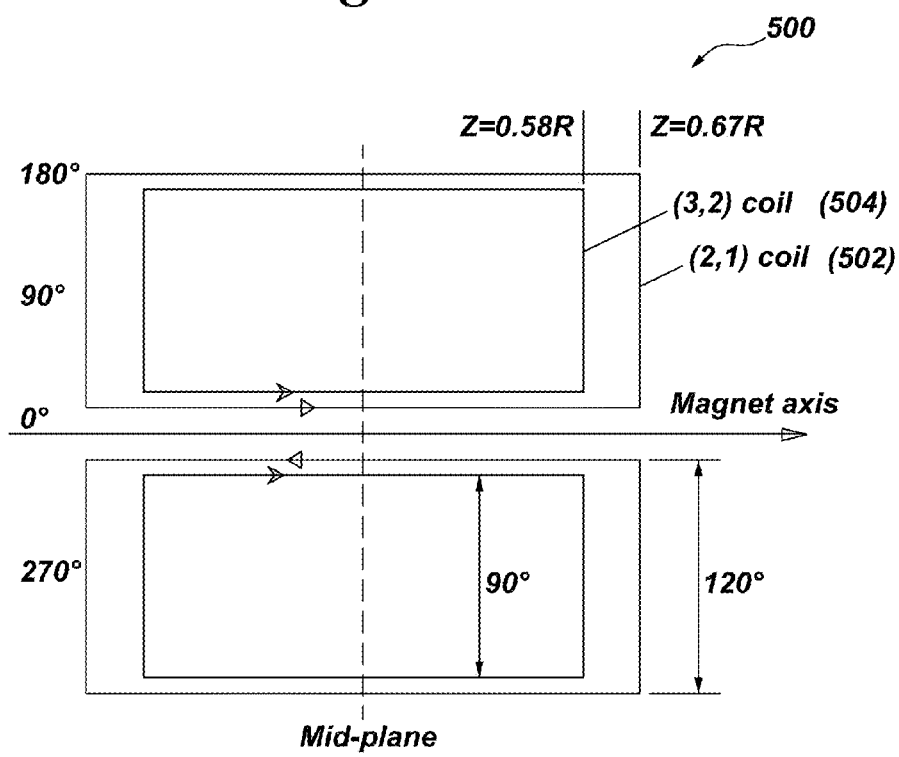
FIG. 5 depicts another embodiment of the invention with two orthogonal two-coil shim sets nested inside each other.
Figure 6:
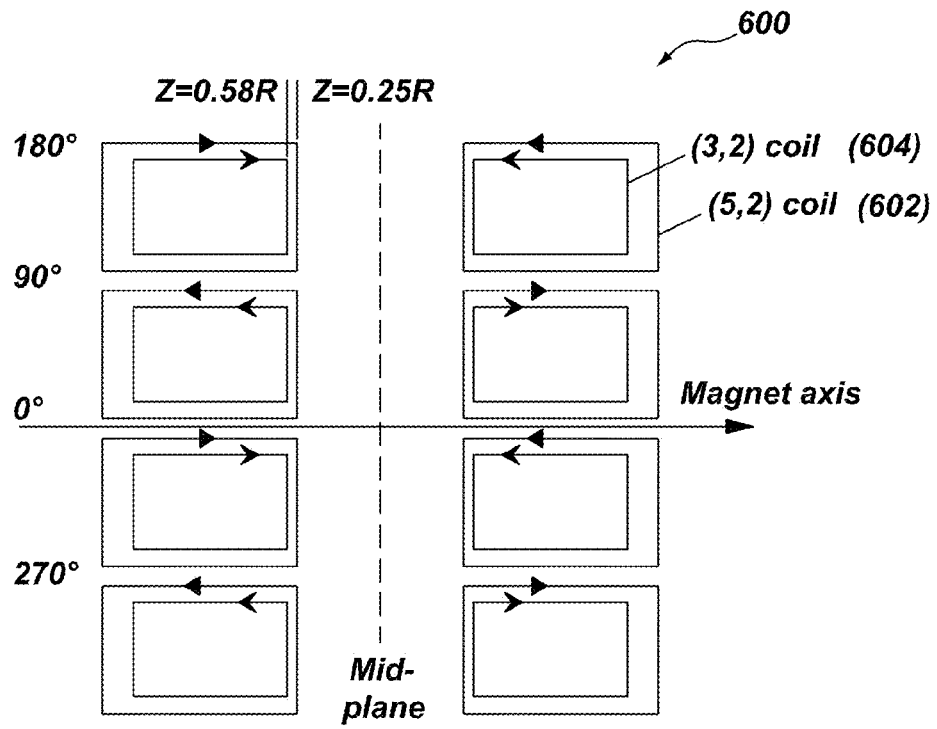
FIG. 6 illustrates an embodiment of the invention for (5,2) and (3,2) shim sets.

As illustrated in FIGS. 4-6, arrangements of the (3,2) set are depicted with other shim sets. Various coil arrangements are possible including orthogonal and matrix shims, symmetric and non-symmetric shim configurations.

FIG. 4 depicts a nested shim coil assembly 400 including a (3,2) shim set 402 inside the (2,2) shim set 404. Here, as in FIGS. 5-6, the specified axial location of the inner arcs provides shims with canceled next higher-order harmonics. For example, the (2,2) shim set generates zero (4,2) term if the arcs are located at z=0.34R. See FIG. 3A.

For exemplary purposes, and not limitation, both (2,2) shim set 404 and (3,2) shim set 402 each comprise eight coils. The high-purity (3,2) coils are inside the (2,2) coils because the high-purity arcs are at the axial position z=0.58R and 0.34R, respectively. Due to non-identical direction of current, these shim sets 404 and 402 have zero coupling with each other. In this embodiment, the inner (3,2) set has a smaller than preferred 90-degree (90°) angle. In one aspect, this results in reduced strength per unit length of conductor and degraded purity due to non-zero higher order harmonics (e.g. (5,4), (7,4), etc.). See FIG. 3B. The latter terms are canceled at the 90° angle.

A nested shim coil assembly 500 is shown in FIG. 5; a nested (3,2) shim set 504 is positioned inside a (2,1) shim set 502. In this embodiment, both shim sets 504 and 502 may have preferred high-purity angles of 120° and 90° respectively. As such, no trade-offs are needed in using the (2,1) shim set. Due to elimination of two saddle coils, the (3,2) set may have induced current due to non-zero coupling with the Z-gradient coil and (3,0) axial shim set. For instance, during ramping of gradient coils, significant currents and voltages may be induced in the (3,2) shim set. These currents may result in conductor overload, overheating and permanent damage, excessive forces on shim conductor, longer field settling time after gradient ramp, overload of shim drivers (in case of resistive shims), and other negative effects. In extreme cases, the gradient coil performance may also be degraded resulting in a poor image quality. Furthermore, coupling with other shim sets may result in degraded image quality.

In the nested shim coil assembly 600 of FIG. 6, a (3,2) shim set 604 is nested inside the (5,2) shim set 602. This embodiment is similar to FIG. 4. In contrast, FIG. 3B shows that saddle coils cannot generate the (5,2) harmonic with the zero (3,2) harmonic. If, however, two sets are used, it is possible to generate any combination of the (3,2) and (5,2) terms including the (5,2) term with zero (3,2) term. The inner arc of the outer coils of the (5,2) shim set is located at $z=0.25R$, thus generating a maximum strength (5,2) term and a non-zero (3,2) term. The (3,2) shim generates the (3,2) harmonic that cancels this harmonic produced by the (5,2) set. In one aspect, the shim sets have zero coupling with the magnet, gradient coils and axial shim sets. In another aspect, there is a non-zero coupling between the (3,2) and (5,2) sets. In utilizing resistive shims, this coupling may have a negligible negative effect in slightly increased settling time. In utilizing superconducting shims, coupling between shims may result in distorted shim currents and degraded magnet quality. This effect may be mitigated by proper ramping of the shim coils.

Various embodiments may also encompass multiple nested coils. For exemplary purposes, and not limitation, the nested shim configurations may include more than two independent shim sets. In addition, three shim sets may be stacked in a single radial assembly by combining the embodiments of FIG. 4 and FIG. 6. In this case, saddle coils of the (2,2) shim set are located between coils of the (3,2) and (5,2) sets.

Figure 7:
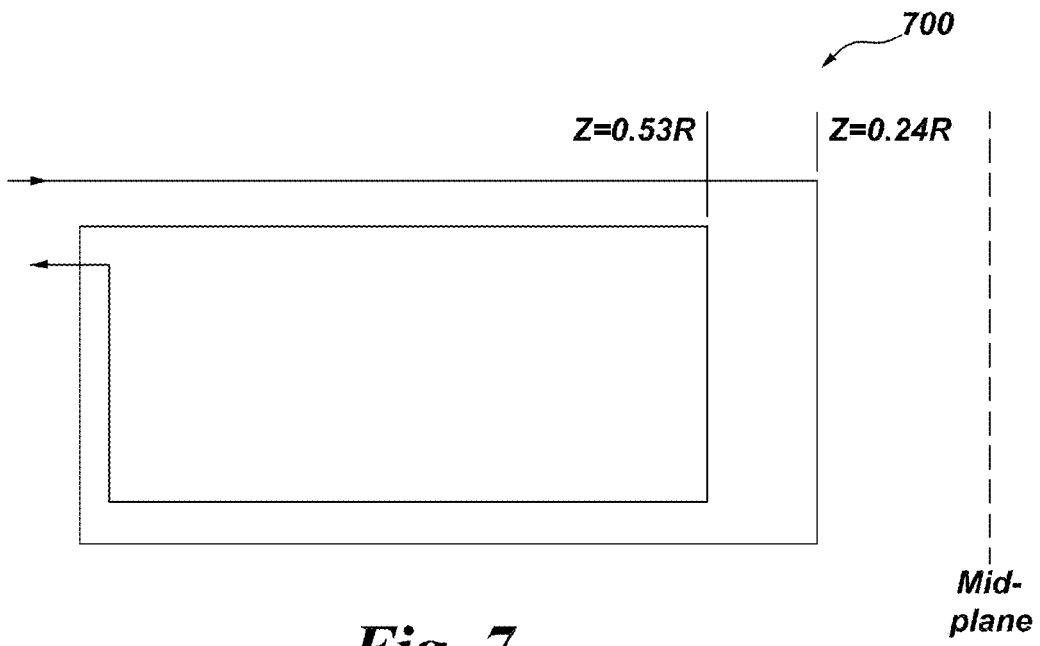
FIG. 7 illustrates an embodiment of the invention including a compact shim set with improved shim purity.

In another embodiment, shim coil 700 may be utilized with distributed turns, as shown in FIG. 7. In the description of independent shim coils above, concentrated current loops were assumed. In yet another embodiment, the advantages of distributed current-carrying conductor turns have been evaluated. These embodiments address improvements of shim purity in nested or distributed shim coil configurations.

As shown in FIG. 1, configuration of the (2,2) shim with the inner arc at $z=0.34R$ produces zero (4,2) harmonic and 0.45 units of the (6,2) harmonic. If turns of this shim coil 700 are evenly split, as shown in FIG. 7, with half of the turns located at $z=0.24R$ and the other half of the turns located at $z=0.53R$, this set provides a significantly higher purity at about the same strength. The (6,2) harmonic is 23% of the maximum possible strength while the (4,2) harmonic is zero (See FIG. 3A). Note that harmonics with the order M divisible by four are zero if the coil angle is 90 degrees. As such, the distributed turns may be used for reduction or cancellation of other harmonics such as the (4,4) term if the angle is not 90 degrees. FIG. 7 depicts distributed turns in shim coils with the (2,2) shim sets.

In another embodiment, nested harmonic shim coils are arranged on a printed circuit board (PCB). The plain PCB can be made from glass-reinforced epoxy laminate sheets (e.g. FR4) or a poly (4,4'-oxydiphenylene-pyromellitimide) substrate, e.g. Kapton film, as utilized in flexible electronics. The Kapton PCB is then bent around the cylinder.

Further, embodiments have utilized nested shim coils applied to a matrix shim solution, where a nested smaller rectangular coil is positioned inside a larger rectangular coil. The nested shim coils are arranged in a K×L array of typically saddle coils; K elements along the z-axis of the system and L elements around the circumference of the cylinder.

Various embodiments of the invention may encompass any number of designs, shapes and sizes as discussed above.

While individual embodiments have been thus described, the individual embodiments of the saddle shape coils and nested coil assemblies may be integrated and combined for use in MRI systems.

While the invention has been described in considerable detail with reference to a few exemplary embodiments only, it will be appreciated that it is not intended to limit the invention to these embodiments only, since various modifications, omissions, additions and substitutions may be made to the disclosed embodiments without materially departing from the scope of the invention. In addition, many modifications may be made to adapt to a particular situation or an installation, without departing from the essential scope of the invention. Thus, it must be understood that the above invention has been described by way of illustration and not limitation. Accordingly, it is intended to cover all modifications, omissions, additions, substitutions or the like, which may be comprised within the scope and the spirit of the invention as defined by the claims.

The invention claimed is:

1. A nested shim coil assembly for shimming the magnetic field of a magnetic resonance system by generating spherical harmonics of a sine type and a cosine type of the magnetic field in order to compensate radial harmonics, the nested shim coil assembly comprising a plurality of saddle-shape coils each having electrical connections, said saddle-shape coils configured in pairs to define at least a first set of saddle-shape coils and a second set of saddle-shape coils, wherein the first set of saddle-shape coils shim a field with a first degree order and a first degree index, and having a first azimuthal span, and the second set of saddle-shape coils shim a second order and a second degree index, and having a second azimuthal span, wherein the first set of saddle-shape coils are nested within the second set of saddle-shape coils to occupy a reduced radial space;

wherein the first azimuthal span is less than the second azimuthal span, and wherein the combination of the first order and the first degree index are different from the second order and the second degree index, and the first set of saddle-shape coils and the second set of saddle-shape coils are combined together in the same radial assembly; and wherein the first set of saddle-shape coils has a first direction of current and the second set of saddle-shape coils has a second direction of current non-identical to the first direction of current.

2. The nested shim coil assembly of claim 1, wherein the first set of saddle-shape coils shim the spherical harmonic of the sine type of the magnetic field and the second set of saddle-shape coils shim the spherical harmonic of the cosine type of the magnetic field, or vice versa; wherein the sine type and the cosine type are positioned at a rotation of at or less than about 90° per order from each other.

3. The nested shim coil assembly of claim 2, wherein the electrical connections of the plurality of saddle-shape coils are connected in series.

4. The nested shim coil assembly of claim 2, wherein the first set of saddle-shape coils has at least four arcs that determine the first azimuthal span less and the second set of saddle-shape coils has at least four arcs that determine the second azimuthal span, and when combined together, a resulting azimuthal span is less than 360°.

5. The nested shim coil assembly of claim 4, wherein an arc at z displacements greater than zero have a reduced shim strength and an improved shim purity.

6. The nested shim coils of claim 4, wherein an arc has an axial location normalized to a shim radius.

7. The nested shim coil assembly of claim 2, wherein the first and second sets of saddle-shape coils have zero coupling with each other.

8. The nested shim coil assembly of claim 2, wherein the plurality of saddle-shape coils include multiple nested arc conductors of varying lengths within the same radial assembly.

9. The nested shim coil assembly of claim 2, wherein the first and second sets of saddle-shape shims are constructed on a single printed circuit board.

10. The nested shim coil assembly of claim 9, wherein the single printed circuit board is flexible.

11. A magnetic field shimming system for a magnetic resonance imaging system comprising:
    a nested shim coil assembly comprising a plurality of saddle-shape coils each having electrical connections, said saddle-shape coils configured in pairs to define at least a first set of saddle-shape coils and a second set of saddle-shape coils, wherein the first set of saddle-shape coils shim a field with a first degree order and a first degree index, and having a first azimuthal span, and the second set of saddle-shape coils shim a second order and a second degree index, and having a second azimuthal span, wherein the first set of saddle-shape coils are nested within the second set of saddle-shape coils to occupy a reduced radial space;
    wherein the first azimuthal span is less than the second azimuthal span, and wherein the combination of the first order and the first degree index are different from the second order and the second degree index, and the first set of saddle-shape coils and the second set of saddle-shape coils are combined together in the same radial assembly; and wherein the nested shim coil further comprises turns of each saddle-shape coil evenly split such that the turns are distributed to reduce harmonics, and a first current loop associated with one saddle-shape coil has a different current direction than a second current loop associated with an adjacent saddle-shape coil; wherein the nested shim coil assembly is cylindrical and adapted for fitting within a bore of a magnet, and along its axis of symmetry adapted for receiving a subject;
    a power supply for supplying electrical power to the nested shim coil assembly,
    a set of electrical connections adapted for supplying current to an arc conductor of each nested shim coil assembly; and
    a first control system adapted for controlling the electrical power supplied by the power supply.

12. The magnetic field shimming system of claim 11, wherein at least one nested shim coil assembly has non-zero coupling with the magnet.

13. The magnetic field shimming system of claim 11, wherein at least one nested shim coil assembly has zero coupling with the magnet, gradient coils and axial shim sets; and non-zero coupling between the first set of saddle-shape coils and the second set of saddle-shape coils.

14. The magnetic field shimming system of claim 11, wherein higher-order harmonics are reduced wherein the nested shim coil assembly comprises at least an eight-coil configuration.

15. The magnetic field shimming system of claim 11, wherein the first saddle-shape coil and the second saddle-shape coil have high-purity angles of about 120° and about 90°.

16. The magnetic field shimming system of claim 11, further comprising more than one nested shim coil assembly arranged in a single radial assembly.

17. The magnetic field shimming system of claim 11, wherein distributed turns of the arc conductors cancel the harmonics.

18. The magnetic field shimming system of claim 11, wherein the nested shim coil assembly is integrated with matrix shims.

19. The magnetic field shimming system of claim 11, wherein the nested shim coil assembly is arranged in a set of multiple saddle coils.

* * * * *